(12) United States Patent
Wallis

(10) Patent No.: US 9,825,597 B2
(45) Date of Patent: Nov. 21, 2017

(54) IMPEDANCE TRANSFORMATION CIRCUIT FOR AMPLIFIER

(71) Applicant: Skyworks Solutions, Inc., Woburn, MA (US)

(72) Inventor: Leslie Paul Wallis, Ottawa (CA)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/389,097

(22) Filed: Dec. 22, 2016

(65) Prior Publication Data

US 2017/0194918 A1 Jul. 6, 2017

Related U.S. Application Data

(60) Provisional application No. 62/273,225, filed on Dec. 30, 2015.

(51) Int. Cl.

| | | |
|---|---|---|
| H04B 1/26 | (2006.01) |
| H03F 1/56 | (2006.01) |
| H03F 3/195 | (2006.01) |
| H03F 1/34 | (2006.01) |
| H03F 1/22 | (2006.01) |
| H03F 3/213 | (2006.01) |
| H04B 1/16 | (2006.01) |

(52) U.S. Cl.
CPC ............ *H03F 1/565* (2013.01); *H03F 1/223* (2013.01); *H03F 1/342* (2013.01); *H03F 3/195* (2013.01); *H03F 3/213* (2013.01); *H04B 1/1607* (2013.01); *H03F 2200/18* (2013.01); *H03F 2200/294* (2013.01); *H03F 2200/387* (2013.01); *H03F 2200/451* (2013.01); *H03F 2200/75* (2013.01)

(58) Field of Classification Search
CPC .......... H03F 1/565; H03F 1/223; H03F 1/342; H03F 3/193; H03F 3/213; H04B 1/1607
USPC .......................................................... 455/314
See application file for complete search history.

(56) References Cited

U.S. PATENT DOCUMENTS

| | | |
|---|---|---|
| 4,122,403 A | 10/1978 | Cave |
| 4,159,450 A | 6/1979 | Hoover |
| 6,549,077 B1 | 4/2003 | Jou |
| 6,977,552 B2 | 12/2005 | Macedo |
| 7,911,269 B2 | 3/2011 | Yang et al. |
| 2002/0067205 A1 | 6/2002 | Aparin et al. |
| 2007/0046376 A1 | 3/2007 | Van Der Heijden |
| 2010/0233975 A1* | 9/2010 | Wu ...................... H04W 52/52 |
| | | 455/115.1 |
| 2010/0237947 A1 | 9/2010 | Xiong et al. |

(Continued)

OTHER PUBLICATIONS

International Search Report of Mar. 20, 2017 for International Patent Application No. PCT/US2016/068712, 3 pages.

(Continued)

*Primary Examiner* — Sanh Phu
(74) *Attorney, Agent, or Firm* — Knobbe, Martens, Olson & Bear, LLP

(57) ABSTRACT

Aspects of this disclosure relate to an impedance transformation circuit for use in an amplifier, such as a low noise amplifier. The impedance transformation circuit includes a matching circuit including a first inductor. The impedance transformation circuit also includes a second inductor. The first and second inductors are magnetically coupled to each other to provide negative feedback to linearize the amplifier.

21 Claims, 9 Drawing Sheets

(56) References Cited

U.S. PATENT DOCUMENTS

| | | |
|---|---|---|
| 2011/0018635 A1 | 1/2011 | Tasic et al. |
| 2013/0009704 A1 | 1/2013 | Liao |
| 2013/0331043 A1 | 12/2013 | Perumana et al. |
| 2014/0015614 A1* | 1/2014 | Oliveira ............... H03F 1/26 330/307 |
| 2014/0253242 A1 | 9/2014 | Youssef et al. |
| 2014/0266461 A1 | 9/2014 | Youssef et al. |
| 2014/0348274 A1 | 11/2014 | Youssef et al. |
| 2015/0035600 A1 | 2/2015 | Jin et al. |
| 2016/0164476 A1* | 6/2016 | Wang ............... H03F 1/565 330/250 |

OTHER PUBLICATIONS

Written Opinion of the International Searching Authority of Mar. 20, 2017 for International Patent Application No. PCT/US2016/068712, 8 pages.

Wikipedia contributors, "Common source," *Wikipedia, The Free Encyclopedia. Wikipedia*, https://en.wikipedia.org/wiki/Common_source (accessed: Jun. 28, 2017).

Wikipedia contributors, "Common emitter," *Wikipedia, The Free Encyclopedia. Wikipedia*, https://en.wikipedia.org/wiki/Common_emitter (accessed: Jun. 28, 2017).

\* cited by examiner

IMPEDANCE TRANSFORMATION CIRCUIT FOR AMPLIFIER

CROSS REFERENCE TO PRIORITY APPLICATION

This application claims the benefit of priority of U.S. Provisional Patent Application No. 62/273,225, filed Dec. 30, 2015 and titled "IMPEDANCE TRANSFORMATION CIRCUIT FOR AMPLIFIER," the disclosure of which is hereby incorporated by reference in its entirety herein.

BACKGROUND

Technical Field

Embodiments of this disclosure relate to electronic systems and, in particular, to impedance transformation circuits for amplifiers.

Description of Related Technology

A low noise amplifier (LNA) can receive a radio frequency (RF) signal from an antenna. The LNA can be used to boost the amplitude of a relatively weak RF signal. Thereafter, the boosted RF signal can be used for a variety of purposes, including, for example, driving a switch, a mixer, and/or a filter in an RF system.

LNAs can be included in a variety of applications, such as base stations or mobile devices, to amplify signals of a relatively wide range of frequencies. For example, a low noise amplifier (LNA) can be used to provide low noise amplification to RF signals in a frequency range of about 30 kHz to 300 GHz.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an impedance transformation circuit for use in an amplifier. The impedance transformation circuit includes a matching circuit including a first inductor. The impedance transformation circuit also includes a second inductor. The first and second inductors are magnetically coupled to each other to provide negative feedback to linearize the amplifier.

The second inductor can be configured as a degeneration inductor. For instance, the second inductor can be configured as a source degeneration inductor. Alternatively, the second inductor can be configured as an emitter degeneration inductor.

The first inductor can provide a radio frequency signal to an amplification circuit of the amplifier. The first inductor, the second inductor, and the amplification circuit of amplifier can be embodied on a single die.

The matching circuit can include a series inductor having a first end and a second end, in which the first end is configured to receive a radio frequency signal and the second end is electrically coupled to the first inductor. The matching circuit can include a shunt capacitor electrically coupled to the first end of the series inductor. Alternatively or additionally, the matching circuit can include a direct current blocking capacitor configured to provide the radio frequency signal to the series inductor.

Another aspect of this disclosure is a low noise amplifier (LNA) that includes a matching circuit including a first inductor, an amplification circuit, and a second inductor. The amplification circuit is configured to receive a radio frequency signal by way of the first inductor and to amplify the radio frequency signal. The first and second inductors are magnetically coupled to each other to provide negative feedback to linearize the LNA.

The amplification circuit can include a common source amplifier and the second inductor can be a source degeneration inductor. The amplification circuit can include a cascode field effect transistor having a source electrically connected to a drain of the common source amplifier.

The amplification circuit can include a common emitter amplifier and the second inductor can be an emitter degeneration inductor. The amplification circuit can include a cascode bipolar transistor having an emitter electrically connected to a collector of the common emitter amplifier.

The first inductor, the second inductor, and the amplification circuit of amplifier can be embodied on a single die.

The matching circuit can include a series inductor having a first end and a second end, in which the first end is configured to receive the radio frequency signal and the second end is electrically coupled to the first inductor. The matching circuit can further include a shunt capacitor electrically coupled to the first end of the series inductor. The matching circuit can include a direct current blocking capacitor configured to provide the radio frequency signal to the series inductor.

Another aspect of this disclosure is a front end system that includes a low noise amplifier and a bypass path. The low noise amplifier includes a matching circuit including a first inductor, an amplification circuit configured to receive a radio frequency signal by way of the first inductor and to amplify the radio frequency signal, and a second inductor magnetically coupled with the first inductor to provide negative feedback to linearize the low noise amplifier.

The front end system can include a multi-throw switch having at least a first throw electrically connected to the low noise amplifier and a second throw electrically connected to the bypass path. The low noise amplifier, the multi-throw switch, and the bypass path can be embodied on a single die. The multi-throw can electrically connect an input of the low noise amplifier to an antenna port in a first state, and the multi-throw switch can electrically connect the bypass path to the antenna port in a second state.

The multi-throw switch can include a third throw. The front end system can include a power amplifier, in which the third throw of the multi-throw switch is electrically coupled to the power amplifier. The low noise amplifier, the bypass path, the multi-throw switch, and the power amplifier can be embodied on a single die. The front end system can include a second multi-throw switch having at least a first throw electrically connected to the low noise amplifier and a second throw electrically connected to the bypass path. The low noise amplifier can be included in a first signal path between the multi-throw switch and the second multi-throw switch, and the bypass path can be included in a second signal path between the multi-throw switch and the second multi-throw switch.

The front end system can include an antenna.

The front end system can include one or more suitable features of the impedance transformation circuits and/or the low noise amplifiers discussed herein.

The amplification circuit can include a common source amplifier and the second inductor can be a source degeneration inductor. The amplification circuit can include a cascode field effect transistor having a source electrically connected to a drain of the common source amplifier.

The amplification circuit can include a common emitter amplifier and the second inductor can be an emitter degeneration inductor. The amplification circuit can include a cascode bipolar transistor having an emitter electrically connected to a collector of the common emitter amplifier.

The matching circuit can include a series inductor having a first end and a second end, in which the first end is configured to receive the radio frequency signal and the second end electrically coupled to the first inductor. The matching circuit can include a shunt capacitor electrically coupled to the first end of the series inductor. The matching circuit can include a direct current blocking capacitor configured to provide the radio frequency signal to the series inductor.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF PIE DRAWINGS

Embodiments of this disclosure will now be described, by way of non-limiting example, with reference to the accompanying drawings.

DETAILED DESCRIPTION OF CERTAIN EMBODIMENTS

Figure 1A:
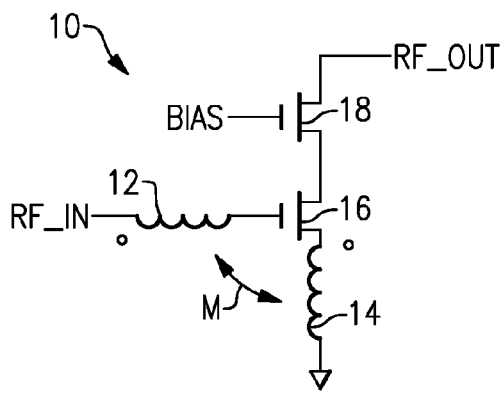
FIG. 1A is a schematic diagram of a low noise amplifier that includes field effect transistors and an impedance transformation circuit according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

There are several performance parameters for any given amplifier design to satisfy simultaneously. Supply current for an amplifier is often pre-determined. In such circumstances, there are relatively few variables that can be manipulated to set the overall behavior of the circuit. This disclosure provides one more controlling variable to set the overall performance of the circuit. In particular, linearity can be improved by implementing features of this disclosure.

In a low noise amplifier (LNA), linearity can be a significant parameter. It can be desirable for an LNA to have a relatively high linearity. Linearity can be measured by a 1 dB compression point and/or a 3rd order intermodulation. Accordingly, a 1 dB compression point and/or a 3rd order intermodulation of an LNA can be significant. Specifications for LNAs and other circuits are specifying higher linearity with lower supply current. This trend is expected to continue. Such specifications can be challenging to meet while also meeting other performance specifications. Accordingly, there is a need for LNAs with improved linearity.

This disclosure provides a new way to control the input match of an LNA, and in such a way the linearity of the LNA can be improved. For instance, using the principles and advantages discussed herein, the 1 dB compression point and 3rd order intermodulation can be improved. This disclosure provides circuits that can extend inductively degenerated amplifier concepts such that both self and mutual inductance effects can improve linearity of an LNA, instead of only self-inductive degeneration.

An LNA can include an inductively degenerated common source or common emitter amplifying device. The inductive degeneration can linearize such a circuit. In addition, the degeneration inductor can set the input impedance of the circuit in conjunction with the size and bias current of the amplifying device. A series input matching inductor at the input can be included to achieve a desired input impedance and obtain a relatively good input match.

Aspects of this disclosure relate to an LNA with magnetic coupling between a degeneration inductor (e.g., a source degeneration inductor or an emitter degeneration inductor) and a series input inductor. These magnetically coupled inductors can in effect provide a transformer, with a primary winding in series with the input and a secondary winding electrically connected where the degeneration inductor is electrically connected to the amplifying device (e.g., at the source of a field effect transistor amplifying device or at the emitter of a bipolar transistor amplifying device). The phase of the magnetic coupling can be significant. This phase is indicated by the dot notation in the accompanying drawings. With the magnetically coupled inductors disclosed herein, inductively degenerated amplifier concepts can be extended by using both self and mutual inductance.

In the LNAs discussed herein, several effects can occur at the same time. Typically, metal oxide semiconductor (MOS) LNAs have a voltage gain from the input of the circuit to a gate of the amplifying device. This voltage gain can degrade the 3rd order intermodulation (IIP3) performance of the circuit. An attenuator is typically not used to reduce signal amplitude because such an attenuator can undesirably degrade the noise performance of the circuit. The LNAs discussed herein can include a negative feedback circuit. An amplifying device of an LNA can receive a radio frequency (RF) signal by way of a first inductor that is magnetically coupled to a degeneration inductor. The first inductor can have a first end configured to receive the RF signal and a second end electrically coupled to the amplifying device. The impedance looking into a node at the first end of the first inductor (e.g., node n2 in FIGS. 2A to 2F) can be increased and the voltage at a node at the second end of the first inductor (e.g., node n3 in FIGS. 2A to 2F) can be decreased. This may not reduce the gain, but the effect can allow the circuit to be scaled differently, with a larger amplifying device. The higher input impedance can also allow the inductance of the input match inductor that provides the RF signal to the first inductor to have a lower value. This can be advantageous when an on chip match inductor is implemented, as the Q of such devices can be limited, and the effective series impedance of the input matching inductor can degrade the noise performance of the LNA. For instance, in one implementation, the input match inductor value is approximately half the value it would otherwise be without the magnetically coupled inductors. While the circuits discussed herein may not give the absolutely best possible noise match, the magnetically coupled inductors can allow the input match inductor to have a lower inductance and thereby recover at least some of the noise performance. The negative feedback provided by magnetically coupled inductors discussed herein can provide an amplifier with increased linearity.

One aspect of this disclosure is an impedance transformation circuit for use in an amplifier. The impedance transformation circuit includes a matching circuit including a first inductor. The impedance transformation circuit also includes a second inductor. The first and second inductors are magnetically coupled to each other to provide negative feedback to linearize the amplifier.

The second inductor can be a degeneration inductor, such as a source degeneration inductor or an emitter degeneration inductor. The first inductor can provide a radio frequency signal to an amplification circuit of the amplifier. The first inductor, the second inductor, and the amplification circuit of amplifier can be embodied on a single die.

The matching circuit can further include a series inductor having a first end and a second end, in which the first end is configured to receive a radio frequency signal and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a low noise amplifier (LNA). The LNA includes a matching circuit including a first inductor, an amplification circuit configured to receive a radio frequency signal by way of the first inductor and to amplify the radio frequency signal, and a second inductor. The first and second inductors are magnetically coupled to each other to provide negative feedback to linearize the LNA.

The amplification circuit can include a common source amplifier or a common emitter amplifier. A cascode transistor can be arranged in series with either of these amplifiers. Such a cascode transistor can be a common drain amplifier or a common base amplifier. The second inductor can be a source degeneration inductor or an emitter degeneration inductor.

The first inductor, the second inductor, and the amplification circuit of amplifier are can be embodied on a single die. The matching circuit can further include a series inductor having a first end and a second end, in which the first end is configured to receive the radio frequency signal and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a front end system that includes a low noise amplifier, a bypass path, and a multi-throw switch. The low noise amplifier includes a matching circuit including a first inductor, an amplification circuit configured to receive a radio frequency signal by way of the first inductor and to amplify the radio frequency signal, and a second inductor magnetically coupled with the first inductor to provide negative feedback to linearize the amplification circuit. The multi-throw switch has at least a first throw electrically connected to the low noise amplifier and a second throw electrically connected to the bypass path.

The front end system can further include a power amplifier. The multi-throw switch can have a third throw electrically coupled to the power amplifier. The low noise amplifier, the bypass path, the multi-throw switch, and the power amplifier can be embodied on a single die.

The front end system can further include a second multi-throw switch having at least a first throw electrically connected to the low noise amplifier and a second throw electrically connected to the bypass path, in which the low noise amplifier is included in a first signal path between the multi-throw switch and the second multi-throw switch, and in which the bypass path is included in a second signal path between the multi-throw switch and the second multi-throw switch.

The multi-throw switch can electrically connect an input of the low noise amplifier to an antenna in a first state, and the multi-throw switch can electrically connect the bypass path to the antenna in a second state. The front end system can further include the antenna. The antenna can be integrated with the low noise amplifier, the bypass path, and the multi-throw switch.

The low noise amplifier, the multi-throw switch, and the bypass path can be embodied on a single die. The front end system can include a package enclosing the low noise amplifier, the multi-throw switch, and the bypass path.

In the front end system, the LNA can include any suitable combination of features of the LNAs and/or amplifiers discussed herein.

FIGS. 1A to 1D illustrate example low noise amplifier that include impedance transformation circuits with magnetically coupled inductors arranged to linearize the low noise amplifiers. And of these low noise amplifiers can be implemented in a receive path in an RF system. The low noise amplifiers can be implemented by any suitable process technology, such as silicon-on-insulator. Any combination of features of the low noise amplifiers of FIGS. 1A to 1D can be implemented as suitable.

FIG. 1A is a schematic diagram of a low noise amplifier (LNA) 10 that includes an impedance transformation circuit according to an embodiment. As illustrated, the LNA 10 includes an impedance transformation circuit and an amplification circuit. The illustrated impedance transformation circuit includes a first inductor 12 and a second inductor 14. The illustrated amplification circuit includes field effect transistors 16 and 18.

The second inductor 14 illustrated in FIG. 1A is a source degeneration inductor that can provide self-inductive degeneration. The first inductor 12 and the second inductor 14 can together provide mutual inductance effects that can improve linearity of the LNA 10. The first inductor 12 and the second inductor 14 can together function as a transformer, with a primary winding in series with a gate of the field effect transistor 16 and a secondary winding electrically connected at the source of the field effect transistor 16. As illustrated, the first inductor 12 is magnetically coupled with the second inductor 14. Accordingly, these inductors can provide negative feedback to linearize the LNA 10. The dot notation in FIG. 1A indicates the phase of magnetic coupling between the first inductor 12 and the second inductor 14.

The amplification circuit illustrated in FIG. 1A includes a common source amplifier 16 and a common gate amplifier 18. An RF input signal RF_IN can be provided to the gate of the common source amplifier 16 by way of the first inductor 12. As illustrated, the common gate amplifier 18 is arranged in series with the common source amplifier 16. Accordingly, the common gate amplifier 18 can be referred to as a cascode transistor or a cascode field effect transistor. A bias circuit can provide a bias signal BIAS to the gate of the common gate amplifier 18. The common gate amplifier 18 can provide an RF output signal RF_OUT.

Figure 1B:
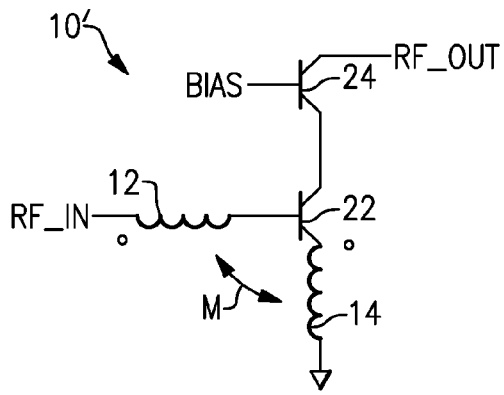
FIG. 1B is a schematic diagram of a low noise amplifier that includes bipolar transistors an impedance transformation circuit according to an embodiment.

FIG. 1B is a schematic diagram of a low noise amplifier 10' that includes an impedance transformation circuit according to an embodiment. The low noise amplifier 10' of FIG. 1B is similar to the low noise amplifier 10 of FIG. 1A, except that the amplification circuit in FIG. 1B is implemented by bipolar transistors instead of field effect transistors. As illustrated in FIG. 1B, the amplification circuit includes bipolar transistors 22 and 24. The amplification circuit of FIG. 1B includes a common emitter amplifier 22 in series with a common base amplifier 24. The second inductor 14 of FIG. 1B is an emitter degeneration inductor.

Figure 1C:
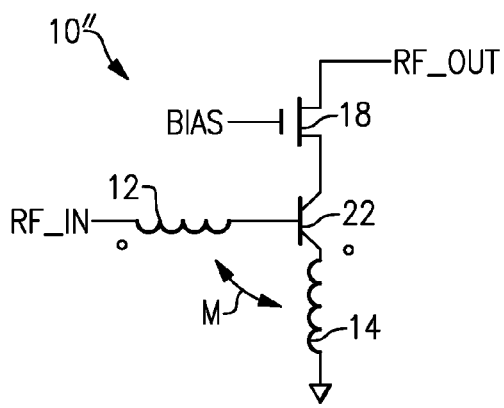
FIG. 1C is a schematic diagram of a low noise amplifier that includes a bipolar transistor, a field effect transistor, and an impedance transformation circuit according to an embodiment.

FIG. 1C is a schematic diagram of a low noise amplifier 10" that includes an impedance transformation circuit according to an embodiment. An amplification circuit of an LNA can include a bipolar transistor and a field effect transistor. The bipolar transistor and the field effect transistor of such an LNA can be arranged in a stack. FIG. 1C illustrates an example of an LNA. 10" that includes a bipolar transistor and a field effect transistor arranged in a stack. As illustrated in FIG. 1C, the LNA 10" includes a bipolar transistor 22 arranged as a common emitter amplifier and a cascode filed effect transistor 18 arranged as a common gate amplifier. Alternatively, a low noise amplifier can include a common source amplifier and a common base amplifier arranged in a stack.

Figure 1D:
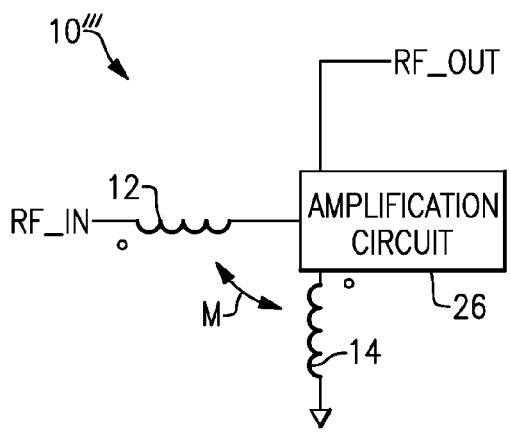
FIG. 1D is a schematic diagram of a low noise amplifier that includes an amplification circuit and an impedance transformation circuit according to an embodiment.

FIG. 1D is a schematic diagram of a low noise amplifier 10''' that includes an impedance transformation circuit according to an embodiment. The amplification circuits shown in FIGS. 1A to 1C are example amplification circuits that can be implemented in connection with an impedance transformation circuit that includes magnetically coupled inductors that provide negative feedback to linearize an LNA. FIG. 1D shows that the first inductor 12 and the second inductor 14 can be implemented in connection with any suitable amplification circuit, as shown by amplification circuit 26. The amplification circuit 26 can be implemented by the amplification circuit of FIG. 1A, the amplification circuit of FIG. 1B, the amplification circuit of FIG. 1C, or any other suitable amplification circuit.

Figure 2A:
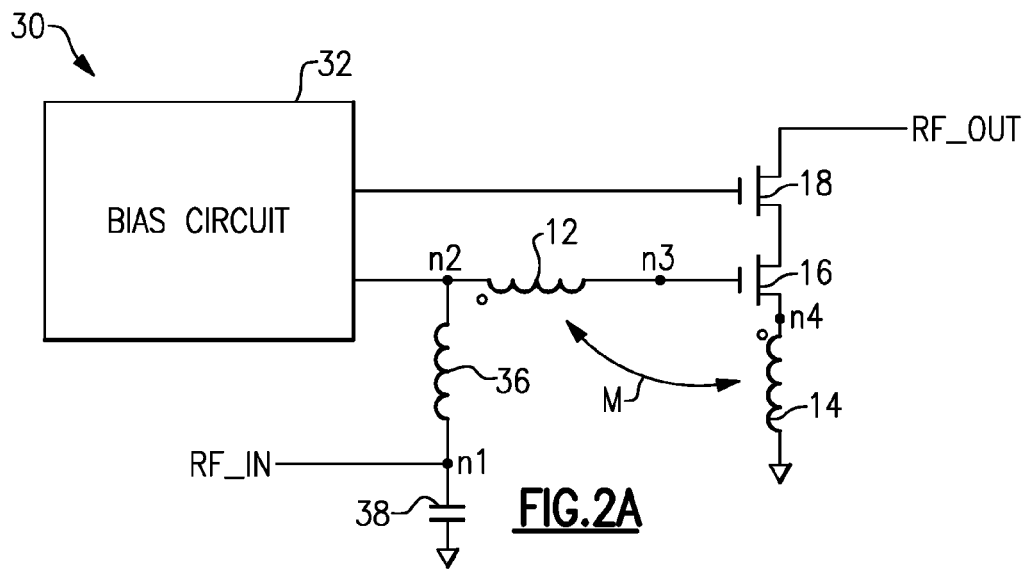
FIG. 2A is a schematic diagram of a low noise amplifier system according to an embodiment.
Figure 2B:
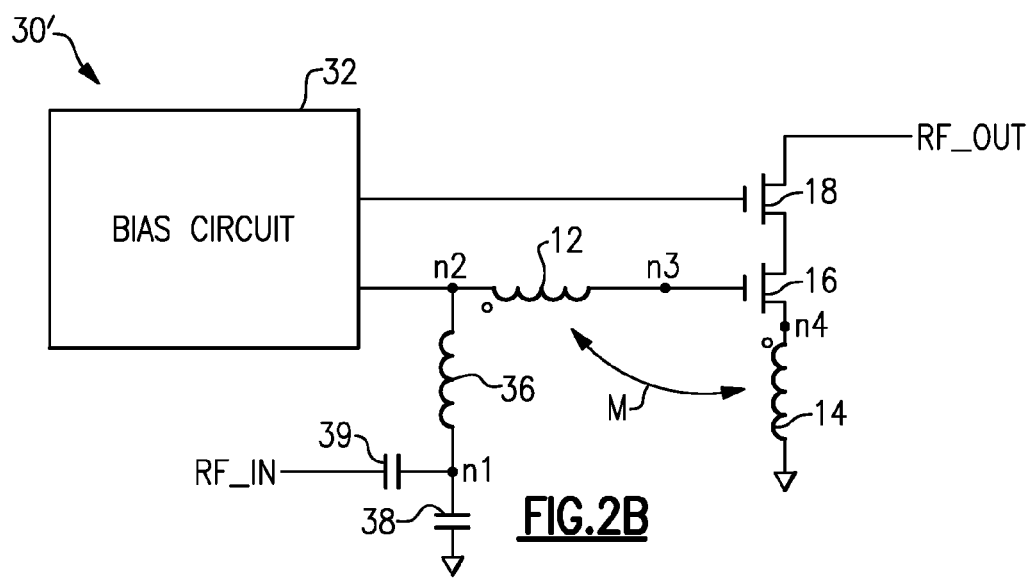
FIG. 2B is a schematic diagram of a low noise amplifier system according to an embodiment.
Figure 2C:
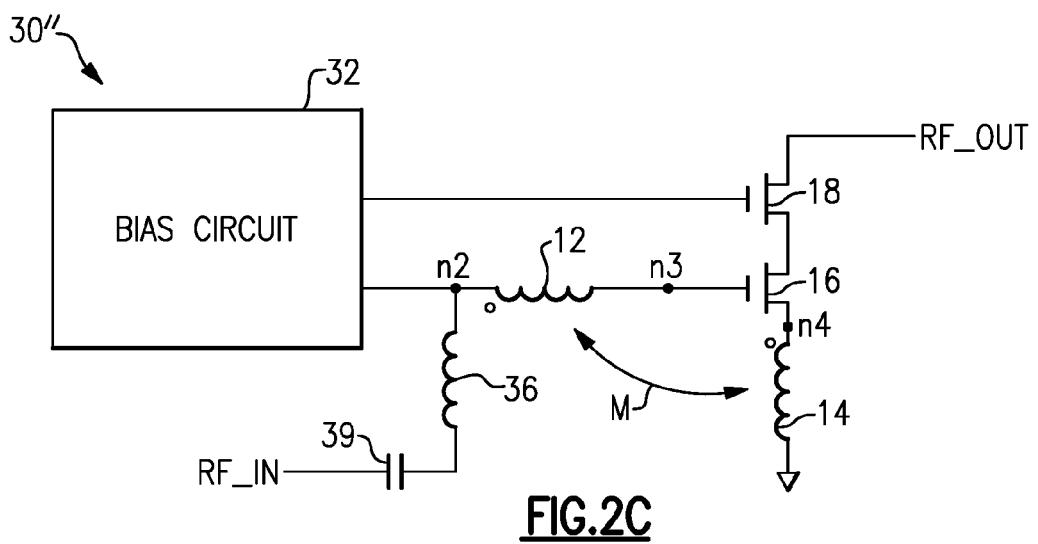
FIG. 2C is a schematic diagram of a low noise amplifier system according to an embodiment.

FIGS. 2A, 2B, and 2C are schematic diagrams of low noise amplifier systems that include low noise amplifiers according to certain embodiments. These LNAs include different input matching circuits. Any of the principles and advantages of these matching circuits can be implemented in connection with any of the amplifiers discussed herein as appropriate.

FIG. 2A is a schematic diagram of a low noise amplifier system 30 that includes an LNA and a bias circuit 32. The LNA illustrated in FIG. 2A includes a matching circuit, an amplification circuit, and a degeneration inductor. The amplification circuit of this LNA corresponds to the amplification circuit of the LNA 10 of FIG. 1A. It will be understood that any of the principles and advantages discussed with reference to FIGS. 2A to 2C can be implemented in connection with other suitable amplification circuits, such as the amplification circuit of the LNA 10' of FIG. 1B and/or the amplification circuit 26 of the LNA 10" of FIG. 1C. In FIG. 2B, the inductors 12 and 14 are magnetically coupled to each other and can function as discussed above.

The matching circuit illustrated in FIG. 2A includes the first inductor 12, a series inductor 36, and a shunt capacitor 38. The matching circuit can provide input impedance matching for the LNA. The RF input signal RF_IN can be provided at node n1. The shunt capacitor 38 is electrically connected to the series inductor 36 at node n1. The shunt capacitor 38 can provide impedance matching at node n1. For instance, the impedance of the shunt capacitor 38 can terminate at a phase corresponding to a fundamental frequency of the RF input signal RF_IN. The RF input signal RF_IN can be provided to the amplification circuit of the LNA by way of the series inductor 36 and the first inductor 12. Magnetic coupling between the first inductor 12 and the second inductor 14 can increase the impedance at node n2. Accordingly, the impedance at node n1 can be increased by this magnetic coupling. Thus, with the increase in impedance from this magnetic coupling, the inductance of the first inductor 12 and/or the inductance of the series inductor 36 can be decreased and provide similar input matching. This can advantageously decrease the physical area of the first inductor 12 and/or the series inductor 36, which can be significant. Inductors with relatively lower inductance can also improve noise performance of the LNA.

The bias circuit 32 can provide a first bias for the common source amplifier 16 at node n2. The first bias can be provided to the gate of the common source amplifier 16 by way of the first inductor 12. In some instances, the bias circuit 32 can provide a second bias to the gate of the common gate amplifier 18. The bias circuit 32 can be implemented by any suitable bias circuit.

The low noise amplifier system 30' of FIG. 2B is similar to the low noise amplifier system 30 of FIG. 2A, except that the matching circuit of the LNA in FIG. 2B also includes a DC blocking capacitor 39. As illustrated, the DC blocking capacitor 39 is coupled between a received RF signal and node n1. The DC blocking capacitor 39 can block DC signal components of the RF input signal RF_IN from being provided to node n1.

The low noise amplifier system 30" of FIG. 2C is similar to the low noise amplifier system 30' of FIG. 2B, except that the matching circuit of the LNA in FIG. 2C does not include the shunt capacitor 38.

Figure 2D:
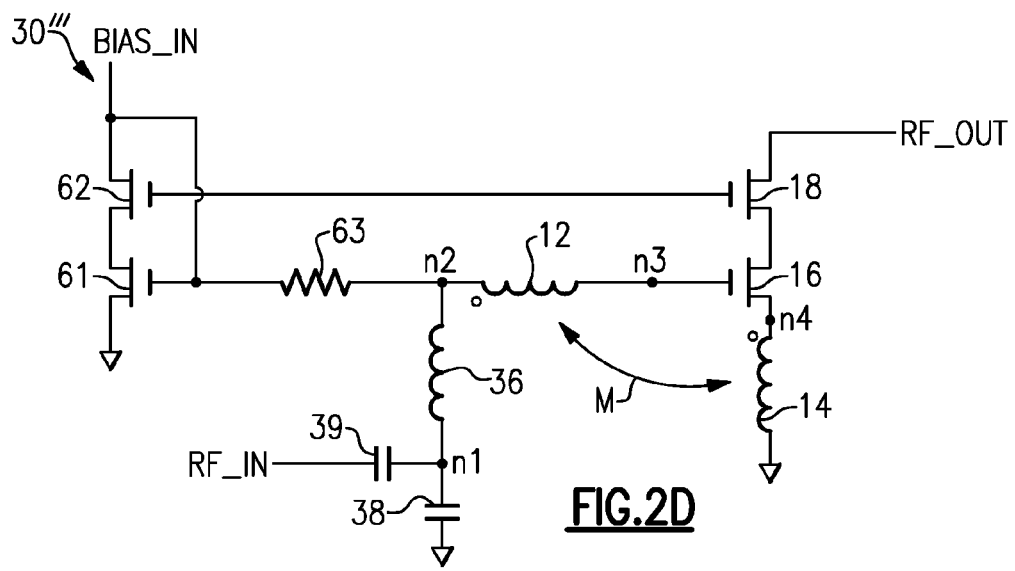
FIG. 2D is a schematic diagram of a low noise amplifier system that includes an illustrative bias circuit according to an embodiment.

FIG. 2D is schematic diagram of low noise amplifier system 30''' that includes an example bias circuit according to an embodiment. The bias circuit of FIG. 2D is an example of the bias circuit 32 of FIGS. 2A to 2C. The bias circuit can include a current mirror to provide a bias signal to an amplification circuit of an LNA. As illustrated in FIG. 2D, the bias circuit includes transistors 61 and 62, and a biasing element 63, such as a resistor. The bias circuit is configured to provide a bias voltage to the transistor 16 by way of the biasing element 63. The biasing input BIAS_IN can be a current provided by a current source.

Figure 2E:
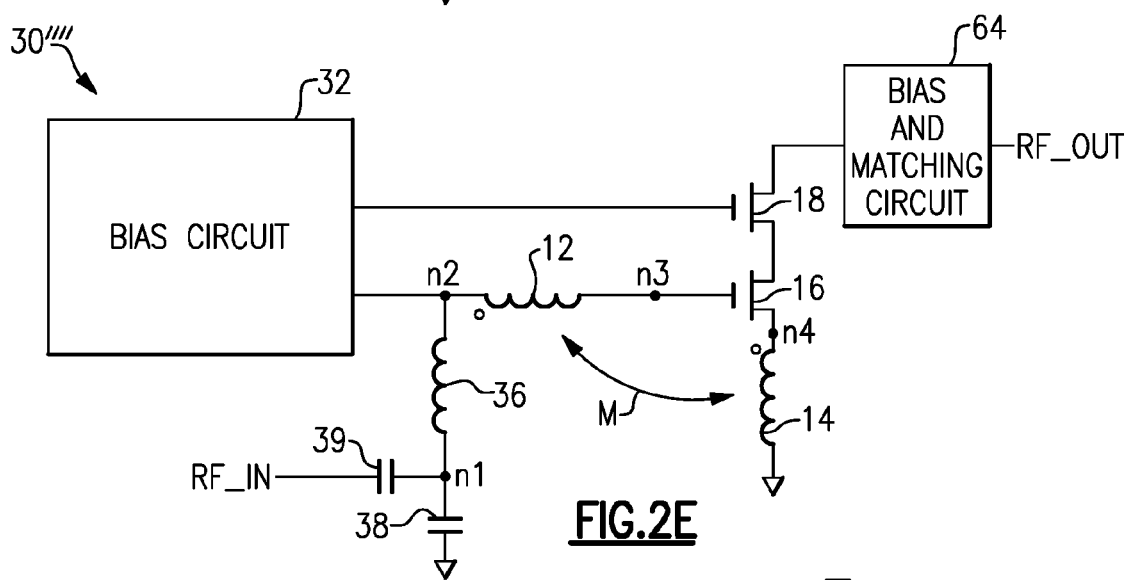
FIG. 2E is a schematic diagram of a low noise amplifier system with a bias and matching circuit according to an embodiment.

FIG. 2E is schematic diagram of low noise amplifier system 30'''' that includes a bias and matching circuit 64 coupled to an output of a low noise amplifier according to an embodiment. The bias and matching circuit 64 can include any suitable circuit elements to bias the output of the LNA and/or to provide impedance matching at the output of the LNA. The bias and matching circuit 64 can be implemented in connection with any of the LNAs discussed herein.

Figure 2F:
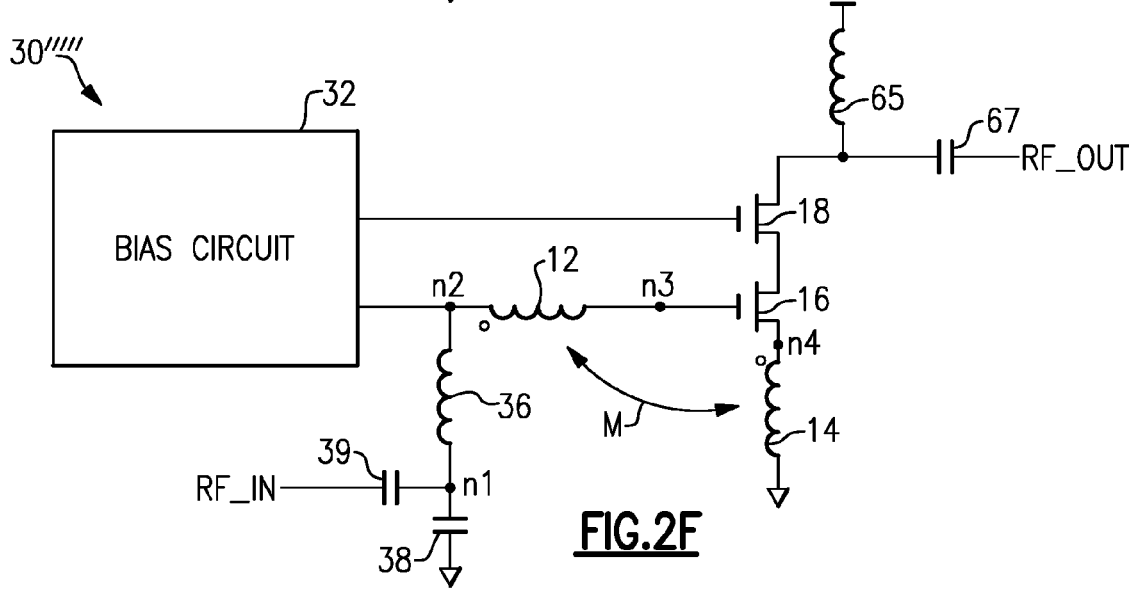
FIG. 2F is a schematic diagram of a low noise amplifier system that includes an illustrative bias and matching circuit according to an embodiment.

FIG. 2F is schematic diagram of low noise amplifier system 30''''' that includes an example bias and matching circuit coupled to an output of a low noise amplifier according to an embodiment. The bias and matching circuit of FIG. 2F is an example of the bias and matching circuit 64 of FIG. 2E. The bias and matching circuit of 2F includes an inductor 65 and a capacitor 67. The inductor 65 can provide a bias to the output of the LNA. The capacitor 67 can provide impedance matching. Other suitable passive impedance networks can alternatively be implemented to provide biasing and impedance matching at the output of the LNA.

Figure 3:
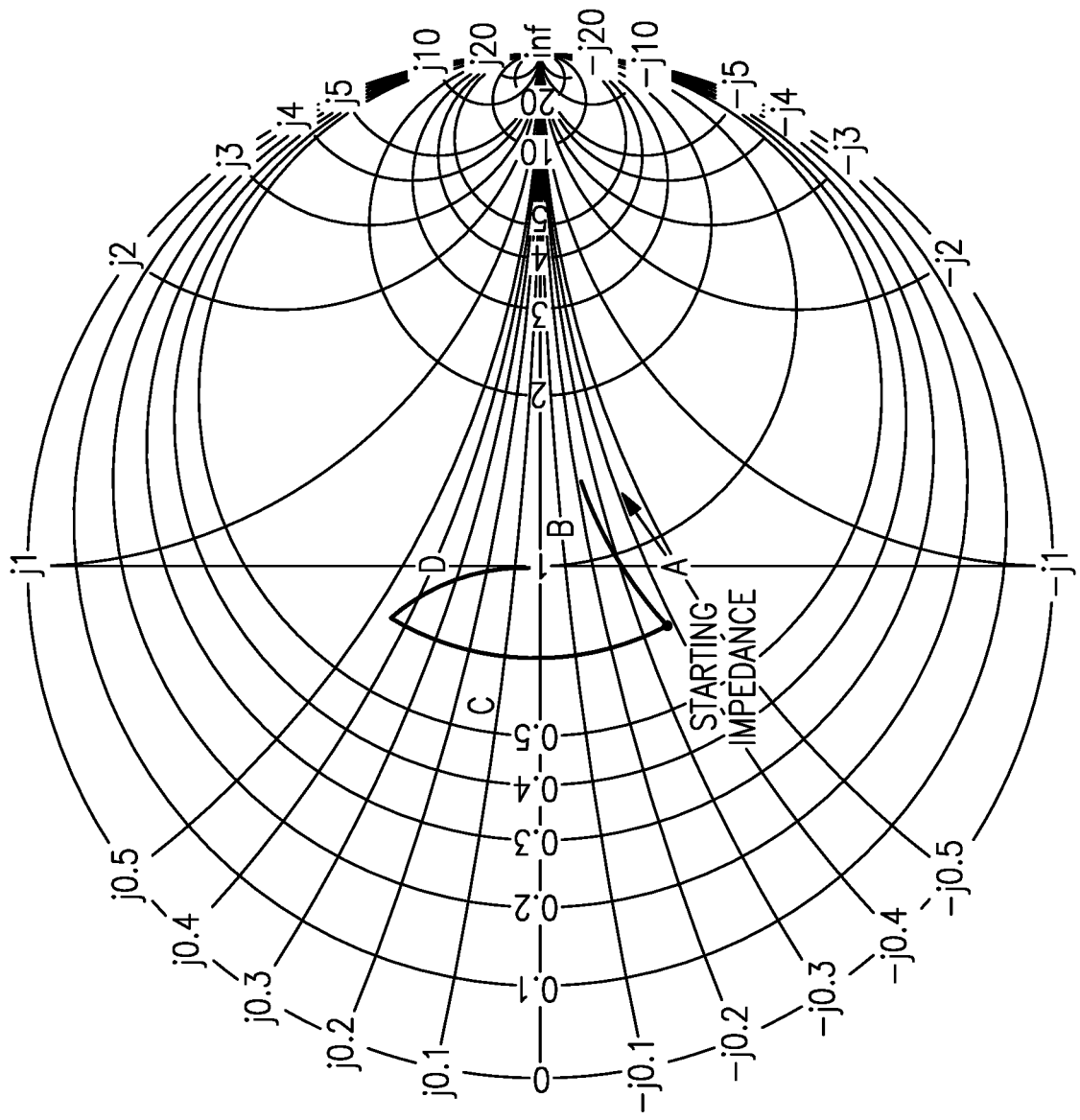
FIG. 3 is a Smith chart corresponding to the passive impedance network of FIG. 2A.

FIG. 3 is a Smith chart corresponding to the matching circuit and the degeneration inductor of the low noise amplifier system of FIG. 2A. This Smith chart shows how the input impedance from the starting impedance varies when the magnetically coupled inductors 12 and 14 are implemented. The arrow on this chart shows the direction for increasing magnetic coupling. Locus A shows how the impedance at node n2 of FIG. 2A varies as the coupling factor is changed between the first inductor 12 and the second inductor 14. Locus A is relatively close to the effect of adding a series resistance. Locus B is the addition of the series inductor 36, from the point where locus A crosses the 50 Ohm resistance line. The net effect is that the series inductor 36 can also be significantly smaller (e.g., in the example shown B=1 nH and C=2.7 nH at 2.5 GHz). Locus C shows the effect of the series inductor 36. Locus D shows the effect of the shunt capacitor 38.

A front end system can include circuits in signal paths between one or more antennas and a baseband system. Some front end systems can include circuits in signal paths between one or more antennas and a mixer configured to modulate a signal to RF or to demodulate an RF signal. Front end systems can process RF signals. Accordingly, front end systems can be referred to as RF front end systems.

FIGS. 4A to 4F are schematic block diagrams of front end systems according to certain embodiments. The front end systems in FIGS. 4A to 4F can be in implemented in a packaged module. The packaged module can be referred to as a front end module. Such packaged modules can include relatively low cost laminate substrate based front end module that combines switch functions with LNAs and/or power amplifiers in certain instances. Some such packaged modules can be multi-chip modules. In certain implementations, one or more of the illustrated components in any of the front end systems in FIGS. 4A to 4F can be embodied on a single die. Such a die can be manufactured using any suitable process technology. As one example, the die can be a semiconductor-on-insulator die, such as a silicon-on-insulator die. According to some implementations, one or more antennas can be integrated with any of the front end systems discussed herein.

Figure 4A:
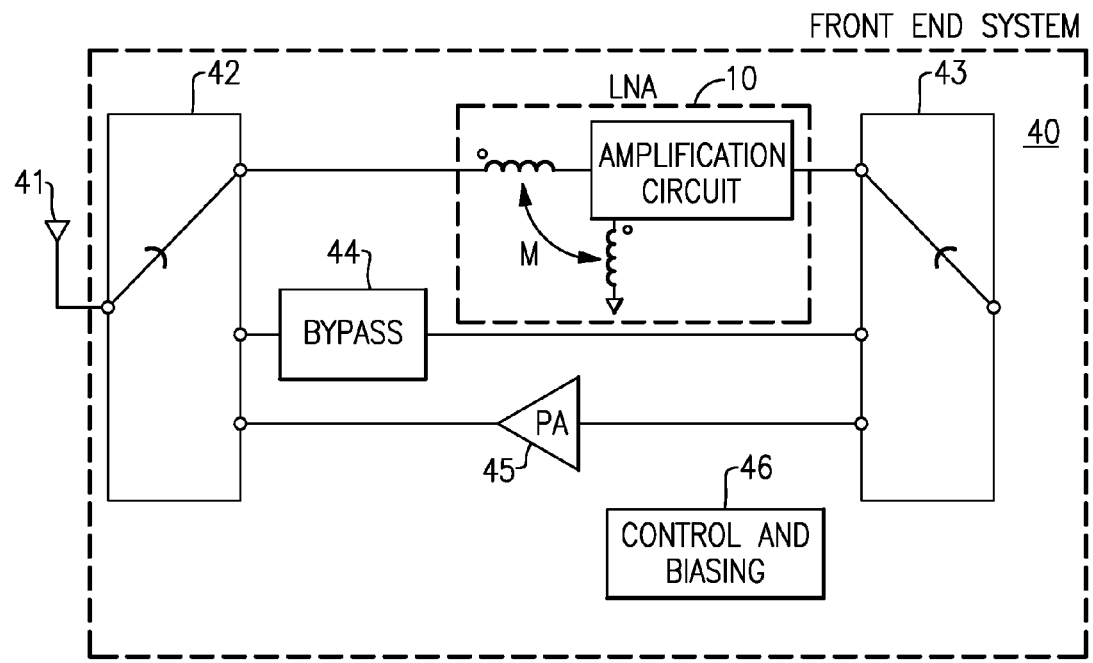
FIG. 4A is a schematic block diagram of front end system that includes a low noise amplifier, a bypass path, a power amplifier, and multi-throw switches according to an embodiment.

FIG. 4A is a schematic block diagram of an RF front end system 40 according to an embodiment. The RF front end system 40 is configured to receive RE signals from an antenna 41 and to transmit RF signals by way of the antenna 41. The illustrated front end system 40 includes a first multi-throw switch 42, a second multi-throw switch 43, a receive signal path that includes an LNA 10, a bypass signal path that includes a bypass network 44, and a transmit signal path that includes a power amplifier 45. The LNA 10 includes an impedance transformation circuit that includes magnetically coupled inductors to provide negative feedback to linearize the LNA 10. The LNA 10 can include any of the principles and advantages of any of the LNAs discussed herein. The bypass network 44 can include any suitable network for matching and/or bypassing the receive signal path and the transmit signal path. The bypass network 44 can be implemented by a passive impedance network or by a conductive trace or wire. The power amplifier 45 can be implemented by any suitable power amplifier configured to amplify am RF signal for transmission via the antenna 41.

The first multi-throw switch 42 can selectively electrically connect a particular signal path to the antenna 41. The first multi-throw switch 42 can electrically connect the receive signal path to the antenna 41 in a first state, electrically connect the bypass signal path to the antenna 41 in a second state, and electrically connect the transmit signal to the antenna 41 in a third state. The second multi-throw switch 43 can selectively electrically connect a particular signal path to an input/output port of the front end system 40, in which the particular signal path is the same signal path electrically connected to the antenna 41 by way of the first multi-throw switch 42. Accordingly, second multi-throw switch 43 together with the first multi-throw switch 42 can provide signal path between the antenna 41 and the input/output port of the front end system 40.

The control and biasing block 46 can provide any suitable biasing and control signals to the front end system 40. For example, the control and biasing block 46 can provide bias signals to the LNA 10 and/or the PA 45. Alternatively or additionally, the control and biasing block 46 can also provide control signals to the multi-throw switches 42 and 43.

Figure 4B:
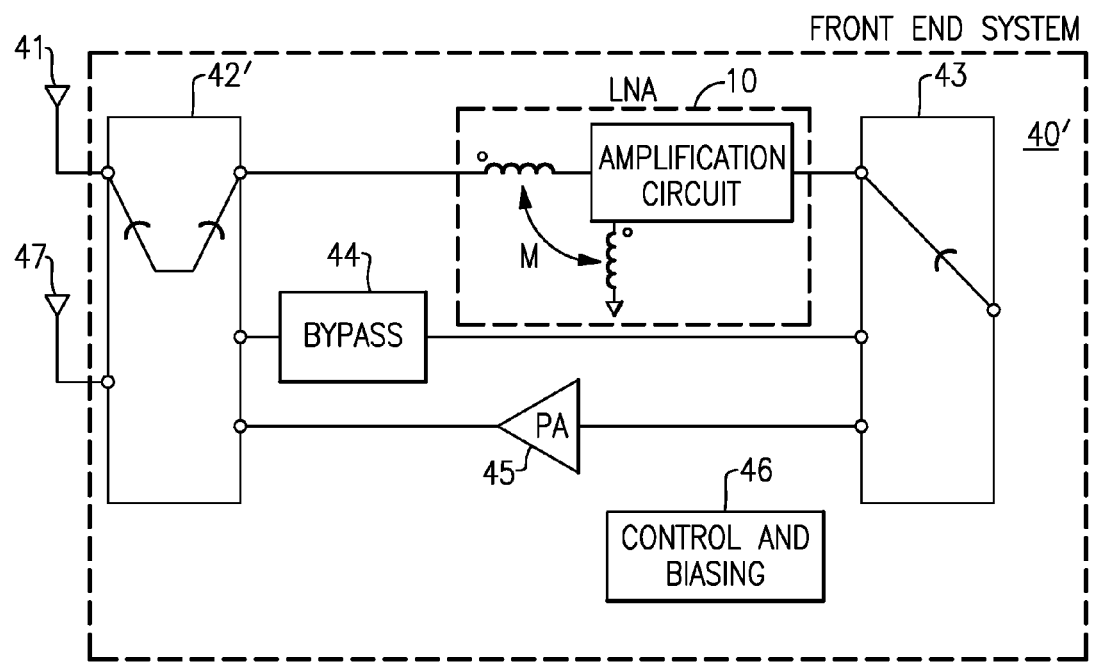
FIG. 4B is a schematic block diagram of front end system that includes a plurality of antenna ports according to an embodiment.

FIG. 4B is a schematic block diagram of an RF front end system 40' according to an embodiment. The RF front end system 40' of FIG. 4B is similar to the RF front end system 40 of FIG. 4A, except the multi-throw switch 42' is configured to selectively electrically connect a particular signal path to either a first antenna 41 or a second antenna 47. The multi-throw switch 42' can be a multi-throw, multi-pole switch.

Figure 4C:
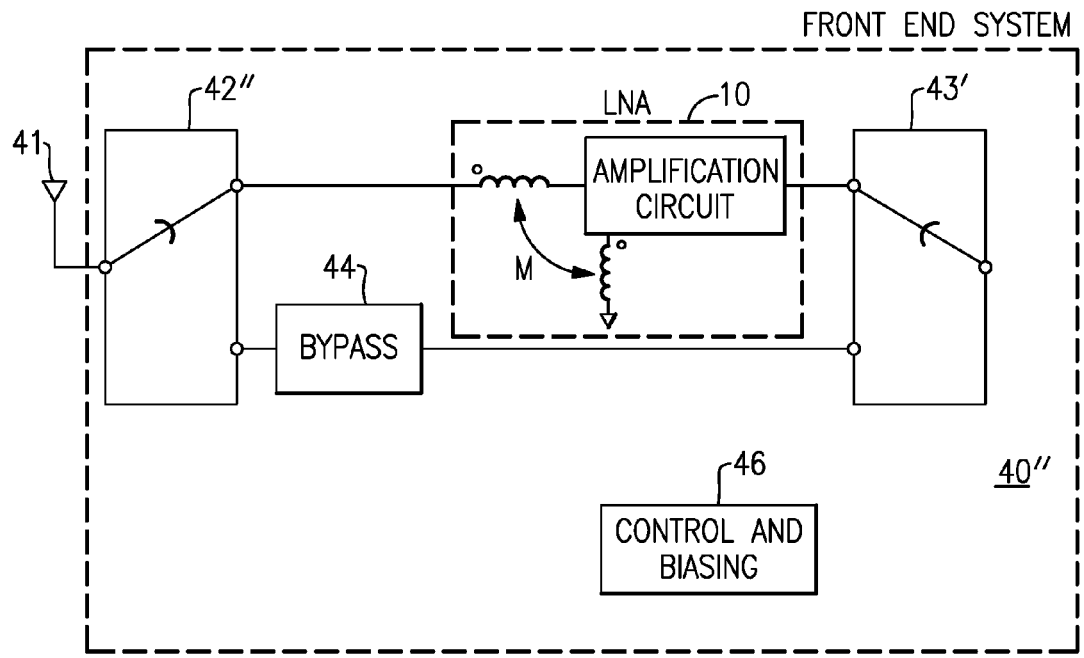
FIG. 4C is a schematic block diagram of front end system that includes a bypass path and low noise amplifier according to an embodiment.

FIG. 4C is a schematic block diagram of an RF front end system 40" according to an embodiment. The RF front end system 40" of FIG. 4C is similar to the RF front end system 40 of FIG. 4A, except that a transmit signal path is omitted and the multi-throw switches 42" and 43' each have one fewer throw. The illustrated front end system 40''' includes a receive signal path and a bypass signal path and does not include a transmit signal path.

Figure 4D:
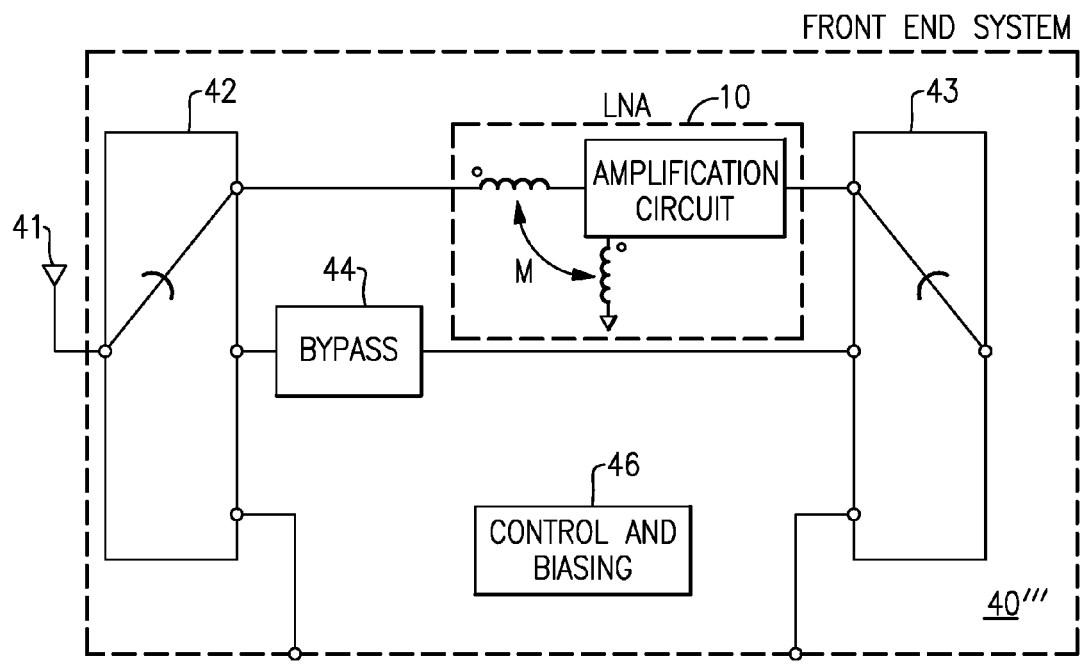
FIG. 4D is a schematic block diagram of front end system that includes a bypass path, ports connectable to a radio frequency signal path such as a transmit path, and low noise amplifier according to an embodiment.

FIG. 4D is a schematic block diagram of an RF front end system 40''' according to an embodiment. The RF front end system 40''' of FIG. 4D is like the RF front end system 40 of FIG. 4A, except that a power amplifier of the transmit signal path is omitted from the RF front end system 40'''. The RF front end system 40''' includes input/output ports for coupling to throws of the multi-throw switches 42 and 43. A power amplifier external to the front end system 40''' can be electrically connected between these input/output ports such that the power amplifier is included in the transmit signal path between the multi-throw switches 42 and 43. The power amplifier can be included in a different packaged module and/or embodied on a different die that the any or all of the illustrated elements of the RF front end system 40'''.

Figure 4E:
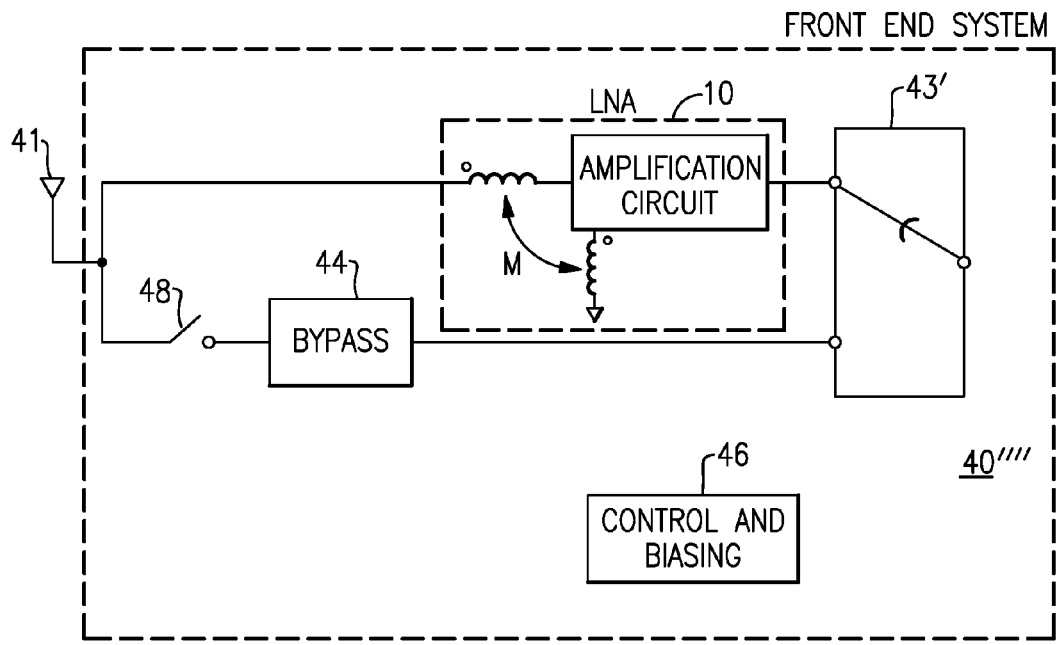
FIG. 4E is a schematic block diagram of front end system with an antenna port coupled to a switch and a low noise amplifier according to an embodiment.

FIG. 4E is a schematic block diagram of an RF front end system 40'''' according to an embodiment. The RF front end system 40'''' of FIG. 4E is like the RF front end system 40" of FIG. 4C, except that an antenna port of the RF front end system 40'''' of FIG. 4E is connected to both the LNA 10 and a switch 48. The switch 48 can selectively electrically connect the antenna port to the bypass path 44. As illustrated, the switch 48 is a single through switch. FIG. 4E illustrates that a front end module can be implemented without a multi-throw switch coupled between an antenna port and an LNA. When the switch 48 is connecting the antenna port to the bypass path 44, an enable signal provided to the LNA 10 can be de-asserted to turn off the LNA 10. This can deactivate the LNA 10 without decoupling an input of the LNA 10 from the antenna port. Without a switch coupled between an input of the LNA 10 and the antenna port, insertion loss in the LNA path can be reduced. The control and biasing circuit 46 can provide the enable signal for the LNA 10 and/or control the switch 48.

Figure 4F:
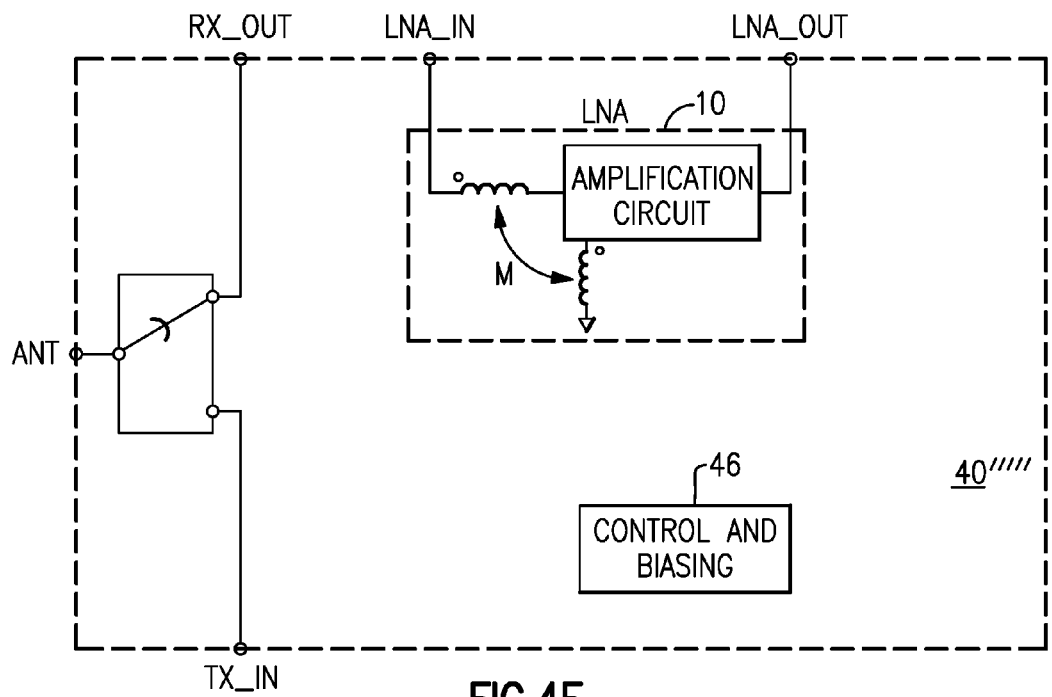
FIG. 4F is a schematic block diagram of front end system according to another embodiment.

FIG. 4F is a schematic block diagram of an RF front end system 40''''' according to an embodiment. The RF front end system 40''''' includes a receive output port RX_OUT and a transmit input port TX_IN to connect with circuitry implemented outside of a front end module. As shown in FIG. 4F, the LNA 10 can have an input connected to an LNA input port LNA_IN and/or and output connected to an LNA output port LNA_OUT of the front end module. This can enable additional circuitry, such as a filter and/or an impedance matching circuit, to be implemented external to the front end module. FIG. 4F also illustrates that the multi-throw switch 43 and/or 43' can be implemented external to a front end module that includes the NA 10.

Figure 4G:
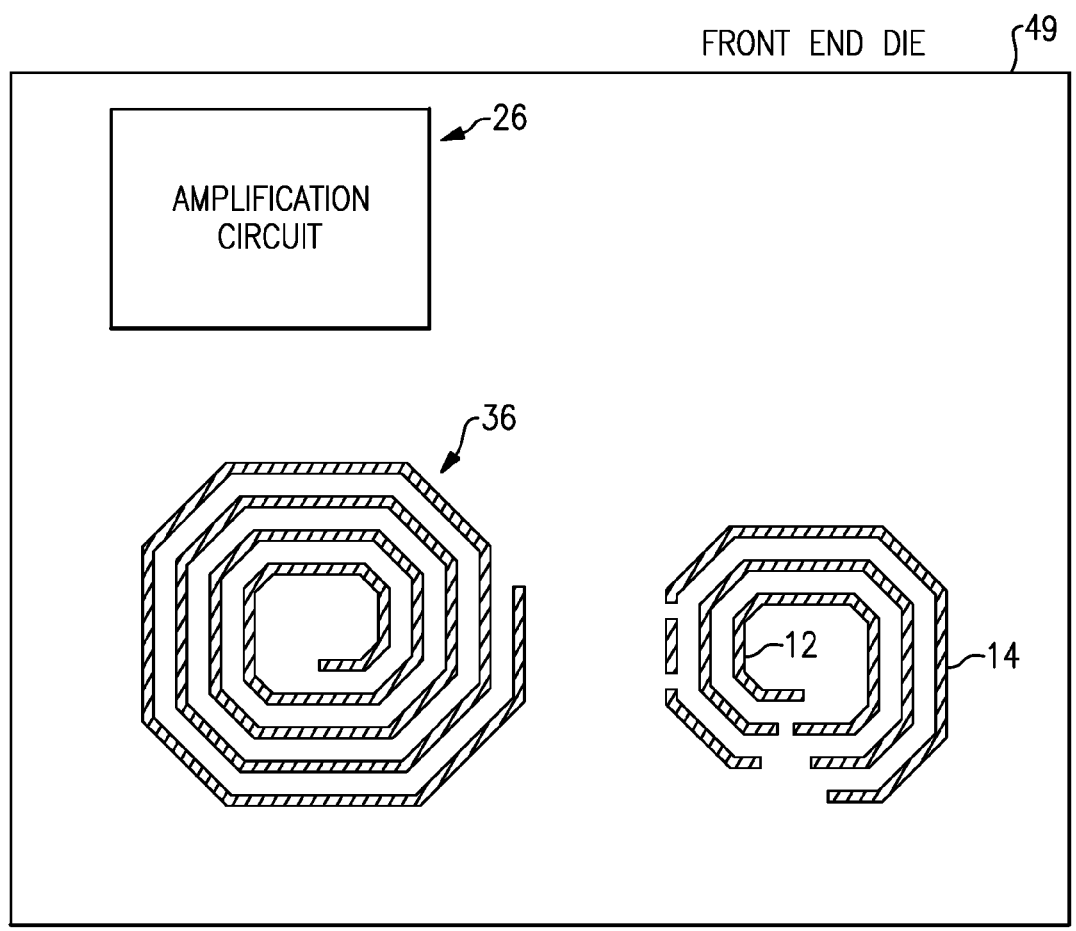
FIG. 4G illustrates a physical layout of magnetically coupled inductors of a low noise amplifier according to an embodiment.

Some or all of the circuit elements of the LNAs and/or front end systems discussed above can be implemented on a single semiconductor die. FIG. 4G illustrates a physical layout of magnetically coupled inductors of a low noise amplifier according to an embodiment. As illustrated, a die 49 includes an amplification circuit 26, a first inductor 12, and a second inductor 14 that is magnetically coupled with the first inductor 12. The die 49 can also include a series inductor 36, as illustrated. The die 49 can be manufactured using any suitable process technology. As one example, the die 49 can be a semiconductor-on-insulator die, such as a silicon-on-insulator die.

The first inductor 12 and the second inductor 14 can each include one or more annular turns. The first inductor 12 and the second inductor 14 can be interleaved with each other. In some instances, the first inductor 12 and/or the second inductor 14 can be implemented in two metal layers with conductive connections between metals in the two metal layers. This can lower resistance of the metal and increase the quality factor of an inductor.

The first inductor 12 and the second inductor can be wound around a magnetic core in some instances. Alternatively, a magnetic core can be implemented around the first inductor 12 and the second inductor 14 in certain applications.

While FIG. 4G is not necessarily to scale, this drawing illustrates that the first inductor 12 and the second inductor 14 can be relatively large and can consume significant physical die area. As also illustrated, the series inductor 36 can be relatively large and can consume significant physical die area. Accordingly, reducing the inductance and thus the size of the first inductor 12 (and/or the series inductor 36 described above) can result in a significant reduction in physical area consumed by an LNA.

Figure 5A:
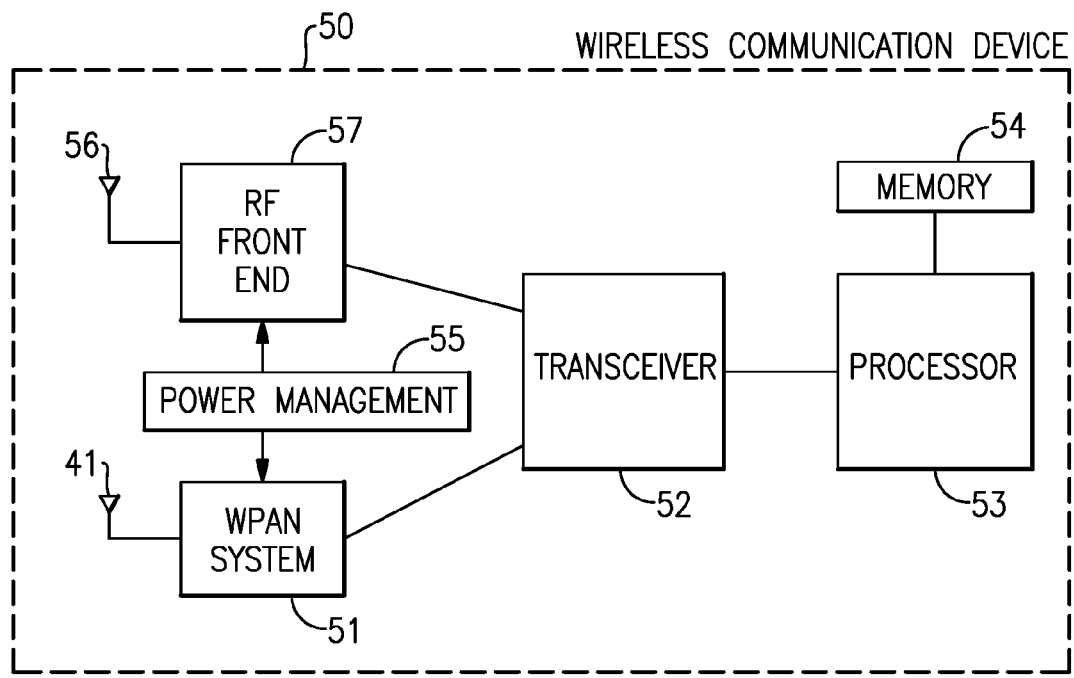
FIGS. 5A and 5B are schematic block diagrams of illustrative wireless communication devices that include low noise amplifiers and/or front end systems in accordance with certain embodiments.
Figure 5B:
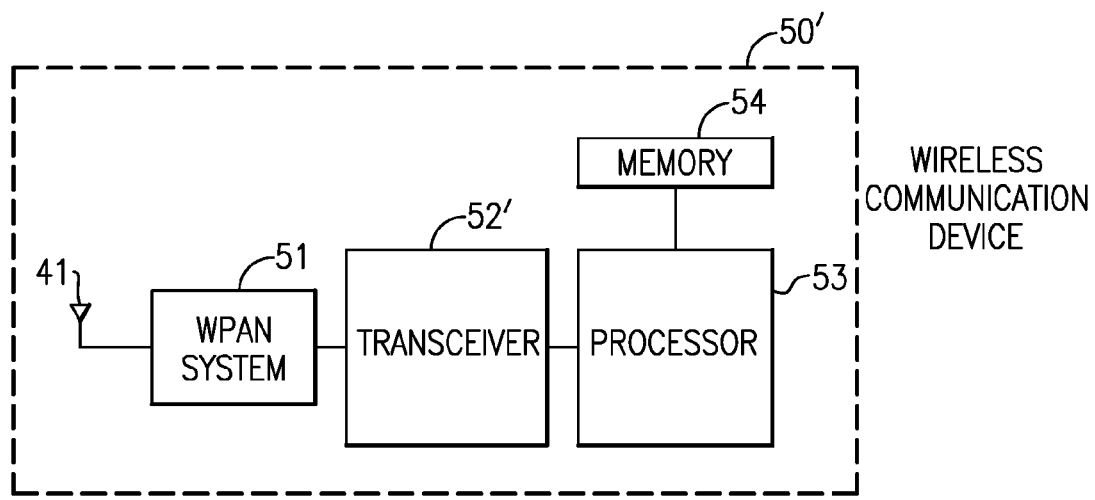

FIGS. 5A and 5B are schematic block diagrams of illustrative wireless communication devices that include a low noise amplifier and/or a front end system in accordance with one or more embodiments. The wireless communication device 50 can be any suitable wireless communication device. For instance, the wireless communication device can be a mobile phone such as a smart phone.

FIG. 5A is a schematic diagram of a wireless communication device 50 according to an embodiment. As illustrated, the wireless communication device 50 includes a first antenna 41, a wireless personal area network (WPAN) system 51, a transceiver 52, a processor 53, a memory 54, a power management block 55, a second antenna 56, and an RF front end system 57. Any of the LNAs and/or impedance transformation circuits discussed herein can be implemented in the WPAN system 51 and/or the RF front end system 57. The WPAN system 51 is an RF front end system configured for processing RF signals associated with personal area networks (PANs). The WPAN system 51 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless local area network (WLAN) system can be in place of the illustrated WPAN system, and the WLAN system can process wireless local area network signals, such as Wi-Fi signals.

FIG. 5B is a schematic diagram of a wireless communication device 50' according to another embodiment. The illustrated wireless communication device 50' of FIG. 5B is a device configured to communicate over a PAN. This wireless communication device can be relatively less complex than the wireless communication device 50 of FIG. 5A. As illustrated, the wireless communication device 50' includes an antenna 41, a WPAN system 51, a transceiver 52', a processor 53, and a memory 54. The WPAN system 51 can include LNAs and/or impedance transformation circuits in accordance with any of the principles and advantages discussed herein. In another embodiment, a wireless local area network (WLAN) system can be implemented in place of the illustrated WPAN system 51, and the WLAN system can process WLAN signals such as Wi-Fi signals.

Any of the principles and advantages discussed herein can be applied to other systems, not just to the systems described above. The elements and operations of the various embodiments described above can be combined to provide further embodiments. Some of the embodiments described above have provided examples in connection with low noise amplifiers, front end modules and/or wireless communications devices. However, the principles and advantages of the embodiments can be used in association with any other systems, apparatus, or methods that could benefit from any of the teachings herein. For instance, any of the impedance transformation circuits discussed can be implemented in any amplifier that could benefit from enhanced linearity. Any of the principles and advantages of the embodiments discussed can be used in any other systems or apparatus that could benefit from an amplifier with enhanced linearity. Any of the principles and advantages discussed herein can be implemented in RF circuits configured to process signals having a frequency in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, wireless communication devices, personal area network communication devices, uplink cellular devices, wireless communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including," and the like are generally to be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected to each other, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. The word "or" in reference to a list of two or more items is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A low noise amplifier comprising:
a matching circuit including a first inductor, a series inductor having a first end configured to receive a radio frequency signal and a second end electrically coupled to the first inductor, and a shunt capacitor electrically coupled to the first end of the series inductor;
an amplification circuit configured to receive the radio frequency signal by way of the first inductor and to amplify the radio frequency signal; and
a second inductor, the first and second inductors magnetically coupled to each other to provide negative feedback to linearize the low noise amplifier.

2. The low noise amplifier of claim 1 wherein the amplification circuit includes a common source amplifier and the second inductor is a source degeneration inductor.

3. The low noise amplifier of claim 2 wherein the amplification circuit further includes a cascode transistor in series with the common source amplifier.

4. The low noise amplifier of claim 1 wherein the amplification circuit includes a common emitter amplifier and the second inductor is an emitter degeneration inductor.

5. The low noise amplifier of claim 4 wherein the amplification circuit further includes a cascode transistor in series with the common emitter amplifier.

6. The low noise amplifier of claim 1 wherein the first inductor, the second inductor, and the amplification circuit of amplifier are embodied on a single die.

7. A low noise amplifier comprising:
a matching circuit including a first inductor, a series inductor having a first end configured to receive a radio frequency signal and a second end electrically coupled to the first inductor, and a direct current blocking capacitor configured to provide the radio frequency signal to the series inductor;

an amplification circuit configured to receive the radio frequency signal by way of the first inductor and to amplify the radio frequency signal; and a second inductor, the first and second inductors magnetically coupled to each other to provide negative feedback to linearize the low noise amplifier.

8. The low noise amplifier of claim 7 wherein the matching circuit further includes a shunt capacitor electrically coupled to the first end of the series inductor.

9. An impedance transformation circuit for use in an amplifier, the impedance transformation circuit comprising:

a matching circuit including a first inductor a series inductor having a first end configured to receive a radio frequency signal and a second end electrically coupled to the first inductor, and at least one of a shunt capacitor electrically coupled to the first end of the series inductor or a direct current blocking capacitor configured to provide the radio frequency signal to the series inductor; and a second inductor, the first and second inductors magnetically coupled to each other to provide negative feedback to linearize the amplifier.

10. The impedance transformation circuit of claim 9 wherein the second inductor is configured as a source degeneration inductor.

11. The impedance transformation circuit of claim 9 wherein the second inductor is configured as an emitter degeneration inductor.

12. The impedance transformation circuit of claim 9 wherein the first inductor is configured to provide the radio frequency signal to an amplification circuit of the amplifier.

13. A front end system comprising:

a low noise amplifier including (i) a matching circuit including a first inductor, a series inductor having a first end configured to receive a radio frequency signal and a second end electrically coupled to the first inductor, and at least one of a shunt capacitor electrically coupled to the first end of the series inductor or a direct current blocking capacitor configured to provide the radio frequency signal to the series inductor; (ii) an amplification circuit configured to receive the radio frequency signal by way of the first inductor and to amplify the radio frequency signal; and (iii) a second inductor magnetically coupled with the first inductor to provide negative feedback to linearize the low noise amplifier; and a bypass path.

14. The front end system of claim 13 further comprising a multi-throw switch having at least a first throw electrically connected to the low noise amplifier and a second throw electrically connected to the bypass path.

15. The front end system of claim 14 further comprising a power amplifier, the multi-throw switch having a third throw electrically coupled to the power amplifier.

16. The front end system of claim 14 further comprising a second multi-throw switch having at least a first throw electrically connected to the low noise amplifier and a second throw electrically connected to the bypass path, the low noise amplifier being included in a first signal path between the multi-throw switch and the second multi-throw switch, and the bypass path being included in a second signal path between the multi-throw switch and the second multi-throw switch.

17. The front end system of claim 14 wherein the multi-throw switch is configured to electrically connect an input of the low noise amplifier to an antenna port in a first state, and the multi-throw switch is configured to electrically connect the bypass path to the antenna port in a second state.

18. The front end system of claim 13 wherein the amplification circuit includes a cascode transistor in series with either a common source amplifier or a common emitter amplifier.

19. The front end system of claim 13 wherein the matching circuit includes the shunt capacitor.

20. The front end system of claim 13 wherein the matching circuit includes the direct current blocking capacitor.

21. The front end system of claim 13 wherein the matching circuit includes the shunt capacitor and the direct current blocking capacitor.

* * * * *

UNITED STATES PATENT AND TRADEMARK OFFICE
CERTIFICATE OF CORRECTION

PATENT NO.           : 9,825,597 B2
APPLICATION NO.      : 15/389097
DATED                : November 21, 2017
INVENTOR(S)          : Leslie Paul Wallis Page 1 of 1

It is certified that error appears in the above-identified patent and that said Letters Patent is hereby corrected as shown below:

In the Claims

In Column 15 at Line 14, in Claim 9, change "first inductor" to --first inductor,--.

Signed and Sealed this
Twenty-sixth Day of March, 2019

Andrei Iancu
*Director of the United States Patent and Trademark Office*